(12) United States Patent
Fouquet et al.

(10) Patent No.: US 9,105,391 B2
(45) Date of Patent: Aug. 11, 2015

(54) HIGH VOLTAGE HOLD-OFF COIL TRANSDUCER

(75) Inventors: Julie E. Fouquet, Portola Valley, CA (US); Gary R. Trott, San Mateo, CA (US); Clark F. Webster, Northfield, MN (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 1256 days.

(21) Appl. No.: 12/370,208

(22) Filed: Feb. 12, 2009

(65) Prior Publication Data
US 2009/0243782 A1 Oct. 1, 2009

Related U.S. Application Data

(63) Continuation-in-part of application No. 12/059,979, filed on Mar. 31, 2008, and a continuation-in-part of application No. 12/059,747, filed on Mar. 31, 2008, now Pat. No. 7,852,186, and a continuation-in-part of application No. 11/512,034, filed on Aug. 28, 2006, now Pat. No. 7,791,900.

(51) Int. Cl.
*H01F 5/00* (2006.01)
*H01F 27/28* (2006.01)
(Continued)

(52) U.S. Cl.
CPC ............ *H01F 27/2804* (2013.01); *H01F 19/04* (2013.01); *H01F 19/08* (2013.01); *H01F 27/324* (2013.01); *H03F 3/45192* (2013.01); *H03F 3/45475* (2013.01); *H03H 7/52* (2013.01); *H04L 25/0266* (2013.01); *H01F 17/0006* (2013.01); *H01F 17/0013* (2013.01); *H01F 27/40* (2013.01); *H01F 2019/085* (2013.01); *H01F 2027/2809* (2013.01); *H01L 2224/48137* (2013.01); *H01L 2224/48195* (2013.01);
(Continued)

(58) Field of Classification Search
USPC .................................. 336/200, 232; 257/531
See application file for complete search history.

(56) References Cited

U.S. PATENT DOCUMENTS 4,027,152 A 5/1977 Brown et al.
4,236,086 A 11/1980 Hoebel
(Continued)

FOREIGN PATENT DOCUMENTS

CN 1180277 6/1996
CN 1237081 12/1999
(Continued)

OTHER PUBLICATIONS

GMR Isolators, John Myers and Ty Fayfiled, Nonvalatile Electronics, Inc., 1998.
(Continued)

*Primary Examiner* — Tsz Chan (57) ABSTRACT

Disclosed herein are various embodiments of coil transducers configured to provide high voltage isolation and high voltage breakdown performance characteristics in small packages. A coil transducer is provided through and across which data or power signals may be transmitted and received by primary and secondary coils disposed on opposing sides thereof without high voltage breakdowns occurring therebetween. A central core layer separates the transmitting and receiving coils, and has no vias disposed therethrough. At least portions of the coil transducer are formed of an electrically insulating, non-metallic, non-semiconductor, low dielectric loss material.

26 Claims, 6 Drawing Sheets

(51) Int. Cl.
*H01L 27/08* (2006.01)
*H01F 19/04* (2006.01)
*H01F 19/08* (2006.01)
*H01F 27/32* (2006.01)
*H03F 3/45* (2006.01)
*H03H 7/52* (2006.01)
*H04L 25/02* (2006.01)
*H01F 17/00* (2006.01)
*H01F 27/40* (2006.01)

(52) U.S. Cl.
CPC ............ *H01L2224/49175* (2013.01); *H01L 2924/3025* (2013.01); *H03F 2203/45008* (2013.01); *H03F 2203/45101* (2013.01); *H03F 2203/45586* (2013.01)

(56) References Cited

U.S. PATENT DOCUMENTS

| | | | |
|---|---|---|---|
| 4,494,100 A | 1/1985 | Stengel et al. | |
| 4,541,894 A | 9/1985 | Cassat | |
| 4,931,075 A * | 6/1990 | Kuhn | 65/384 |
| 5,015,972 A | 5/1991 | Cygan | |
| 5,070,317 A | 12/1991 | Bhagat | |
| 5,312,674 A | 5/1994 | Haertling et al. | |
| 5,363,081 A * | 11/1994 | Bando et al. | 336/200 |
| 5,392,463 A | 2/1995 | Yamada | |
| 5,420,558 A | 5/1995 | Ito et al. | |
| 5,504,668 A | 4/1996 | Beyerlein | |
| 5,597,979 A | 1/1997 | Courtney et al. | |
| 5,659,462 A * | 8/1997 | Chen et al. | 363/21.04 |
| 5,693,871 A | 12/1997 | Stout et al. | |
| 5,716,713 A * | 2/1998 | Zsamboky et al. | 428/457 |
| 5,754,088 A | 5/1998 | Fletcher et al. | |
| 5,768,111 A | 6/1998 | Zaitsu | |
| 5,825,259 A | 10/1998 | Harpham | |
| 5,945,728 A | 8/1999 | Dobkin et al. | |
| 5,952,849 A | 9/1999 | Haigh | |
| 6,091,966 A | 7/2000 | Meadows | |
| 6,167,475 A | 12/2000 | Carr | |
| 6,175,293 B1 | 1/2001 | Hasegawa et al. | |
| 6,198,374 B1 | 3/2001 | Abel | |
| 6,215,377 B1 | 4/2001 | Douriet et al. | |
| 6,255,714 B1 | 7/2001 | Kossives et al. | |
| 6,300,617 B1 | 10/2001 | Daughton | |
| 6,307,457 B1 | 10/2001 | Wissink et al. | |
| 6,320,532 B1 | 11/2001 | Diede | |
| 6,404,317 B1 | 6/2002 | Mizoguchi et al. | |
| 6,476,704 B2 | 11/2002 | Goff | |
| 6,489,850 B2 | 12/2002 | Heineke et al. | |
| 6,501,364 B1 | 12/2002 | Hui et al. | |
| 6,525,566 B2 | 2/2003 | Haigh et al. | |
| 6,538,313 B1 | 3/2003 | Smith | |
| 6,545,059 B1 | 4/2003 | Fichou | |
| 6,556,117 B1 | 4/2003 | Nakao et al. | |
| 6,574,091 B2 | 6/2003 | Heineke et al. | |
| 6,661,079 B1 | 12/2003 | Bikulcius et al. | |
| 6,686,825 B2 * | 2/2004 | Tamezawa et al. | 336/200 |
| 6,819,941 B2 | 11/2004 | Dening | |
| 6,856,226 B2 | 2/2005 | Gardner | |
| 6,859,130 B2 * | 2/2005 | Nakashima et al. | 336/200 |
| 6,867,678 B2 | 3/2005 | Yang | |
| 6,870,456 B2 | 3/2005 | Gardner | |
| 6,873,065 B2 | 3/2005 | Haigh et al. | |
| 6,888,438 B2 | 5/2005 | Hui et al. | |
| 6,891,461 B2 | 5/2005 | Gardner | |
| 6,903,578 B2 | 6/2005 | Haigh et al. | |
| 6,919,775 B2 | 7/2005 | Wendt et al. | |
| 6,922,080 B2 | 7/2005 | Haigh et al. | |
| 6,943,658 B2 | 9/2005 | Gardner | |
| 6,944,009 B2 | 9/2005 | Nguyen et al. | |
| 6,970,040 B1 | 11/2005 | Dening | |
| 7,016,490 B2 | 3/2006 | Beutler et al. | |
| 7,064,442 B1 * | 6/2006 | Lane et al. | 257/773 |
| 7,064,662 B2 | 6/2006 | Goggin | |
| 7,170,807 B2 | 1/2007 | Franzen et al. | |
| 7,171,739 B2 | 2/2007 | Yang et al. | |
| 7,177,370 B2 | 2/2007 | Zhang et al. | |
| 7,302,247 B2 | 11/2007 | Dupuis | |
| 7,376,116 B2 | 5/2008 | Rozenblitz et al. | |
| 7,376,212 B2 | 5/2008 | Dupuis | |
| 7,421,028 B2 | 9/2008 | Dupuis | |
| 7,425,787 B2 | 9/2008 | Larson, III | |
| 7,436,282 B2 | 10/2008 | Whittaker et al. | |
| 7,447,492 B2 | 11/2008 | Dupuis | |
| 7,460,604 B2 | 12/2008 | Dupuis | |
| 7,545,059 B2 | 6/2009 | Chen | |
| 7,577,223 B2 | 8/2009 | Alfano | |
| 7,650,130 B2 | 1/2010 | Dupuis | |
| 7,683,654 B2 | 3/2010 | Chen | |
| 7,692,444 B2 | 4/2010 | Chen | |
| 7,719,305 B2 | 5/2010 | Chen | |
| 7,737,871 B2 | 6/2010 | Leung et al. | |
| 7,741,943 B2 | 6/2010 | Fouquet | |
| 7,746,943 B2 | 6/2010 | Yamaura | |
| 7,821,428 B2 | 10/2010 | Leung | |
| 7,856,219 B2 | 12/2010 | Dupuis | |
| 7,920,010 B2 | 4/2011 | Chen | |
| 7,932,799 B2 | 4/2011 | Loef et al. | |
| 7,948,067 B2 | 5/2011 | Ho | |
| 8,049,573 B2 | 11/2011 | Alfano et al. | |
| 8,061,017 B2 | 11/2011 | Fouquet | |
| 8,064,872 B2 | 11/2011 | Dupuis | |
| 8,093,983 B2 | 1/2012 | Fouquet | |
| 2002/0075116 A1 * | 6/2002 | Peels et al. | 336/200 |
| 2002/0110013 A1 | 8/2002 | Park et al. | |
| 2002/0135236 A1 | 9/2002 | Haigh | |
| 2003/0042571 A1 * | 3/2003 | Chen et al. | 257/531 |
| 2004/0056749 A1 * | 3/2004 | Kahlmann et al. | 336/200 |
| 2005/0003199 A1 * | 1/2005 | Takaya et al. | 428/413 |
| 2005/0057277 A1 | 3/2005 | Chen et al. | |
| 2005/0077993 A1 | 4/2005 | Kanno et al. | |
| 2005/0094302 A1 * | 5/2005 | Matsuzaki et al. | 360/55 |
| 2005/0128038 A1 | 6/2005 | Hyvonen | |
| 2005/0133249 A1 | 6/2005 | Fujii | |
| 2005/0269657 A1 | 12/2005 | Dupuis | |
| 2005/0272378 A1 | 12/2005 | Dupuis | |
| 2006/0028313 A1 | 2/2006 | Strzalkowski et al. | |
| 2006/0095639 A1 | 5/2006 | Guenin et al. | |
| 2006/0152322 A1 | 7/2006 | Whittaker et al. | |
| 2006/0170527 A1 | 8/2006 | Braunisch | |
| 2006/0176137 A1 | 8/2006 | Sato et al. | |
| 2006/0214759 A1 * | 9/2006 | Kawarai | 336/200 |
| 2006/0220775 A1 | 10/2006 | Ishikawa | |
| 2007/0080587 A1 | 4/2007 | Ruizenaar | |
| 2007/0085447 A1 | 4/2007 | Larson, III | |
| 2007/0085632 A1 | 4/2007 | Larson, III et al. | |
| 2007/0086274 A1 | 4/2007 | Nishimura et al. | |
| 2007/0133933 A1 | 6/2007 | Yoon et al. | |
| 2007/0281394 A1 | 12/2007 | Kawabe et al. | |
| 2007/0290784 A1 | 12/2007 | Nesse et al. | |
| 2008/0007382 A1 | 1/2008 | Snyder | |
| 2008/0030080 A1 | 2/2008 | Chen et al. | |
| 2008/0031286 A1 | 2/2008 | Alfano et al. | |
| 2008/0051158 A1 | 2/2008 | Male et al. | |
| 2008/0061631 A1 | 3/2008 | Fouquet et al. | |
| 2008/0174396 A1 | 7/2008 | Choi et al. | |
| 2008/0176362 A1 | 7/2008 | Sengupta et al. | |
| 2008/0179963 A1 | 7/2008 | Fouquet et al. | |
| 2008/0180206 A1 | 7/2008 | Fouquet | |
| 2008/0198904 A1 | 8/2008 | Chang | |
| 2008/0278255 A1 | 11/2008 | Harvey et al. | |
| 2008/0278275 A1 | 11/2008 | Fouquet | |
| 2008/0284552 A1 | 11/2008 | Lim et al. | |
| 2008/0308817 A1 | 12/2008 | Wang et al. | |
| 2008/0311862 A1 | 12/2008 | Spina | |
| 2009/0072819 A1 | 3/2009 | Takahashi | |
| 2009/0180403 A1 | 7/2009 | Tudosoiu | |
| 2009/0243783 A1 | 10/2009 | Fouquet et al. | |
| 2009/0268486 A1 | 10/2009 | Ljusev et al. | |
| 2010/0020448 A1 | 1/2010 | Ng et al. | |
| 2010/0052120 A1 | 3/2010 | Pruitt | |
| 2010/0118918 A1 | 5/2010 | Dupuis | |

(56) References Cited

U.S. PATENT DOCUMENTS

| | | |
|---|---|---|
| 2010/0176660 A1 | 7/2010 | Fouquet |
| 2010/0188182 A1 | 7/2010 | Fouquet et al. |
| 2010/0259909 A1 | 10/2010 | Ho et al. |
| 2010/0328902 A1 | 12/2010 | Ho et al. |
| 2011/0075449 A1 | 3/2011 | Fouquet |
| 2011/0095620 A1 | 4/2011 | Fouquet |

FOREIGN PATENT DOCUMENTS

| | | |
|---|---|---|
| DE | 19911133 | 10/2000 |
| DE | 10154906 | 5/2003 |
| EP | 1309033 | 5/2003 |
| EP | 1617337 | 1/2006 |
| JP | 57-39598 | 3/1982 |
| JP | 61-59714 | 3/1986 |
| JP | 3171705 | 7/1991 |
| JP | 06-53052 | 2/1994 |
| JP | H07-86328 | 3/1995 |
| JP | H07-202097 | 8/1995 |
| JP | 08-236696 | 9/1996 |
| JP | 08-241955 | 9/1996 |
| JP | H08-340079 | 12/1996 |
| JP | 10-150068 | 6/1998 |
| JP | 2000-114047 | 4/2000 |
| JP | 2000-508116 | 6/2000 |
| JP | 2001-258022 | 9/2001 |
| JP | 2002-260936 | 9/2002 |
| JP | 2003-17338 | 1/2003 |
| JP | 2003-151829 | 5/2003 |
| JP | 2005-513824 | 5/2005 |
| JP | 2007-086285 | 4/2007 |
| JP | 2008-061236 | 3/2008 |
| JP | 2008-236365 | 10/2008 |
| JP | 2008-289257 | 11/2008 |
| JP | 2009-035028 | 2/2009 |
| JP | 2009-094576 | 4/2009 |
| WO | WO-9734349 | 3/1997 |
| WO | WO-2005/001928 | 6/2005 |
| WO | WO 2006/033071 | 3/2006 |
| WO | WO 2007/053379 | 5/2007 |
| WO | WO 2007/086285 | 8/2007 |
| WO | WO 2009/035028 | 3/2009 |

OTHER PUBLICATIONS

U.S. Appl. No. 11/264,956, filed Nov. 1, 2005, Guenin et al.
U.S. Appl. No. 11/512,034, filed Aug. 28, 2006, Fouquet et al.
U.S. Appl. No. 11/747,092, filed May 10, 2007, Fouquet et al.
"ACCL-9xxx 3.3V/5V High Speed CMOS Capacitive Isolator", *Preliminary Datasheet*, Avago Technologies unknown.
"Advanced Circuit Materials, High Frequency Laminates and Flexible Circuit Materials", Rogers Corporation, www.rogerscorporation.com/mwu/translations/prod.htm Mar. 2008.
"Off the Shelf SMT Planar Transformers", Payton Group International unknown.
"Texas Instruments Dual Digital Isolators", SLLS755E Jul. 2007.
Analog Devices, Inc., , "iCoupler Digital Isolator ADuM1100 Data Sheet,", Rev F 2006.
Chen, Baoxing , "iCoupler Products with isoPower Technology", *"Signal and Power Transfer Across Isolation Barrier Using Microtransformers"* Analog Devices 2006.
Electronic Design, , "Planar Transformers make Maximum Use of Precious Board Space", Penton Media, Inc., ED Online ID #7647 Mar. 9, 1998.
Krupka, J. et al., "Measurements of Permittivity, Loss Dielectric Tangent, and Resistivity of Float-Zone Silicon at Microwave Frequencies", *IEEE Abstract Microwave Theory and Techniques, IEEE Tansaction on* vol. 54, Issue 11 Nov. 2006 , 3995-4001.
Yang, Ru-Yuan , "Loss Characteristics of Silicon Substrate with Different Resistivities", *Microwave and Optical Technology Letters*, vol. 48, No. 9 Sep. 2006.
Analog Devices, , "iCoupler R Digital Isolation Products", 2005.
Chen, Baoxing et al., "High Speed Digital Isolators Using Microscale On-Chip Transformers", Jul. 22, 2003.
Kliger, R. , "Integrated Transformer-Coupled Isolation", Mar. 2003.
Smith, Carl H. et al., "Chip-Size Magnetic Sensor Arrays", May 21, 2002.
Oljaca, Miroslav , "Interfacing the ADS1202 Modulator with a Pulse Transformer in Galvanically Isolated Systems", *SBAA096* Jun. 2003 , 22 pages.
Biersach "Designing Medical Electrical Equipment To Meet Safety Certification and Regulatory Requirements", Underwriters Laboratories, 6 pages, Table 2, Jan. 2002.
Doane et al., "Multichip Module Technologies and Alternatives—The Basics," Section 5.3.2. 1993, 185.

\* cited by examiner

HIGH VOLTAGE HOLD-OFF COIL TRANSDUCER

RELATED APPLICATIONS

This application claims priority and other benefits from, and is a continuation-in-part of: (a) U.S. patent application Ser. No. 12/059,979 filed Mar. 31, 2008 entitled "Galvanic Isolators and Coil Transducers" to Fouquet et al. (hereafter "the '979 patent application"), (b) U.S. patent application Ser. No. 12/059,747 filed Mar. 31, 2008 now U.S. Pat. No. 7,852,186 entitled "Coil Transducer with Reduced Arcing and Improved High Voltage Breakdown Performance Characteristics" to Fouquet et al. (hereafter "the '747 patent application"), and (c) U.S. patent application Ser. No. 11/512,034 filed Aug. 28, 2006 entitled "Galvanic Isolator" to Fouquet et al, (hereafter "the '034 patent application"). This application also hereby incorporates by reference herein in their respective entireties the foregoing '979 and '747 patent applications.

FIELD OF THE INVENTION

Various embodiments of the invention described herein relate to the field of data signal and power transformers or galvanic isolators and coil transducers, and more particularly to devices employing inductively coupled coil transducers to transmit and receive data and/or power signals across a dielectric or isolation barrier.

BACKGROUND

High voltage isolation communication devices known in the prior art include optical devices, magnetic devices and capacitive devices. Prior art optical devices typically achieve high voltage isolation by employing LEDs and corresponding photodiodes to transmit and receive light signals, usually require high power levels, and suffer from operational and design constraints when multiple communication channels are required.

Prior art magnetic devices typically achieve high voltage isolation by employing opposing inductively-coupled coils, usually require high power levels (especially when high data rates are required), typically require the use of at least three separate integrated circuits or chips, and often are susceptible to electromagnetic interference ("EMI").

Prior art capacitive devices achieve voltage isolation by employing multiple pairs of transmitting and receiving electrodes, where for example a first pair of electrodes is employed to transmit and receive data, and a second pair of electrodes is employed to refresh or maintain the transmitted signals. Such capacitive devices typically exhibit poor high voltage hold-off or breakdown characteristics The design of small high speed galvanic isolators presents several formidable technical challenges, such as how to handle electromagnetic interference (EMI), large-magnitude fast transients, and other forms of electrical noise while maintaining high voltage breakdown characteristics, and acceptable data or power transfer rates.

What is needed is a high voltage isolation communication device that is small, consumes reduced power, permits data to be communicated at relatively high data rates, has improved high voltage breakdown capabilities, that may be built at lower cost, or that has other advantages that will become apparent after having read and understood the specification and drawings hereof.

SUMMARY

In one embodiment, there is provided coil transducer comprising a generally planar dielectric barrier and electrically insulating core structure having upper and lower surfaces and comprising a central core layer, an upper core layer disposed above the central core layer and a lower core layer disposed below the central core layer, each of the central, upper and lower core layers comprising an electrically insulating, non-metallic, non-semiconductor, low-dielectric-loss material, a first electrically conductive coil disposed above the core layer, and a second electrically conductive coil disposed below the core layer, where the core layer has no vias disposed therethrough or therein and the first and second coils are spatially arranged and configured respecting one another such that at least one of power and data signals may be transmitted by the first coil to the second coil across the core layer.

In another embodiment, there is provided a method of making a coil transducer comprising forming a generally planar dielectric barrier and electrically insulating core structure having upper and lower surfaces and comprising a central core layer, an upper core layer disposed above the central core layer, and a lower core layer disposed below the central core layer, each of the central, upper and lower core layers comprising an electrically insulating, non-metallic, non-semiconductor, low-dielectric-loss material, providing a first electrical conductor forming a first coil, the first coil being located above the core layer, providing a second electrical conductor forming a second coil, the second coil being located below the core layer, and configuring the first coil, the second coil and the core layer in respect of one another such that the first coil is separated from the second coil by the core layer, the first and second coils are spatially arranged and configured respecting one another such that at least one of power and data signals may be transmitted by the first coil to the second coil across the core layer, and the core layer has no vias disposed therethrough or therein.

Further embodiments are disclosed herein or will become apparent to those skilled in the art after having read and understood the specification and drawings hereof.

BRIEF DESCRIPTION OF THE DRAWINGS

Different aspects of the various embodiments of the invention will become apparent from the following specification, drawings and claims in which:

The drawings are not necessarily to scale. Like numbers refer to like parts or steps throughout the drawings, unless otherwise noted.

DETAILED DESCRIPTION OF SOME PREFERRED EMBODIMENTS

In the following description, specific details are provided to impart a thorough understanding of the various embodiments of the invention. Upon having read and understood the specification, claims and drawings hereof, however, those skilled in the art will understand that some embodiments of the invention may be practiced without hewing to some of the specific details set forth herein. Moreover, to avoid obscuring the invention, some well known circuits, materials and methods finding application in the various embodiments of the invention are not disclosed in detail herein.

In the drawings, some, but not all, possible embodiments of the invention are illustrated, and further may not be shown to scale.

The term "horizontal" as used herein is defined as a plane substantially parallel to the conventional plane or surface of the substrate of the invention, regardless of its actual orientation in space. The term "vertical" refers to a direction substantially perpendicular to the horizontal as defined above. Terms such as "on,", "above," "below," "bottom," "top," "side," "sidewall," "higher," "lower," "upper," "over" and "under" are defined in respect of the horizontal plane discussed above.

Figure 1:
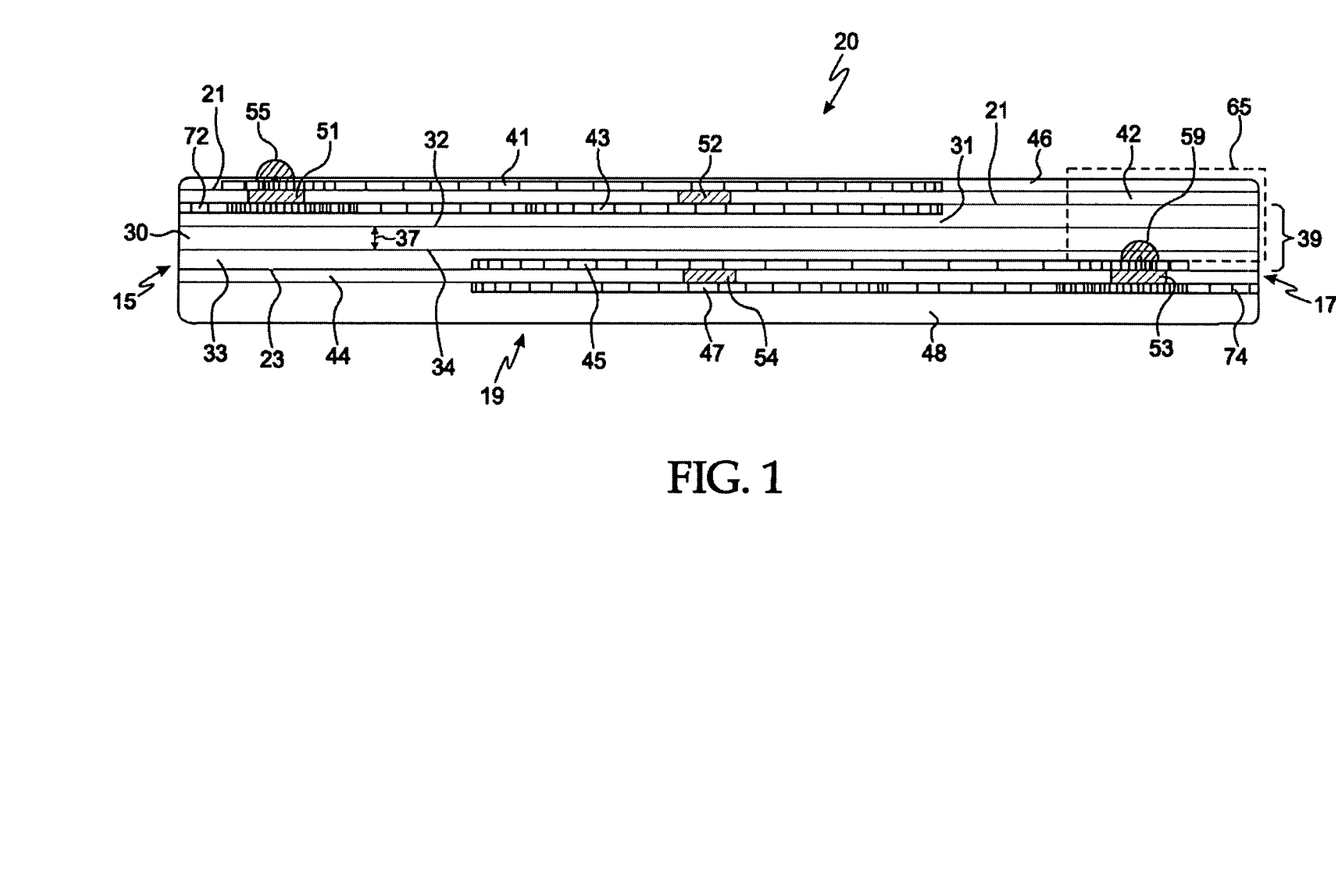
FIG. 1 shows a side cross-sectional view of a coil transducer according to one embodiment.
Figure 2:
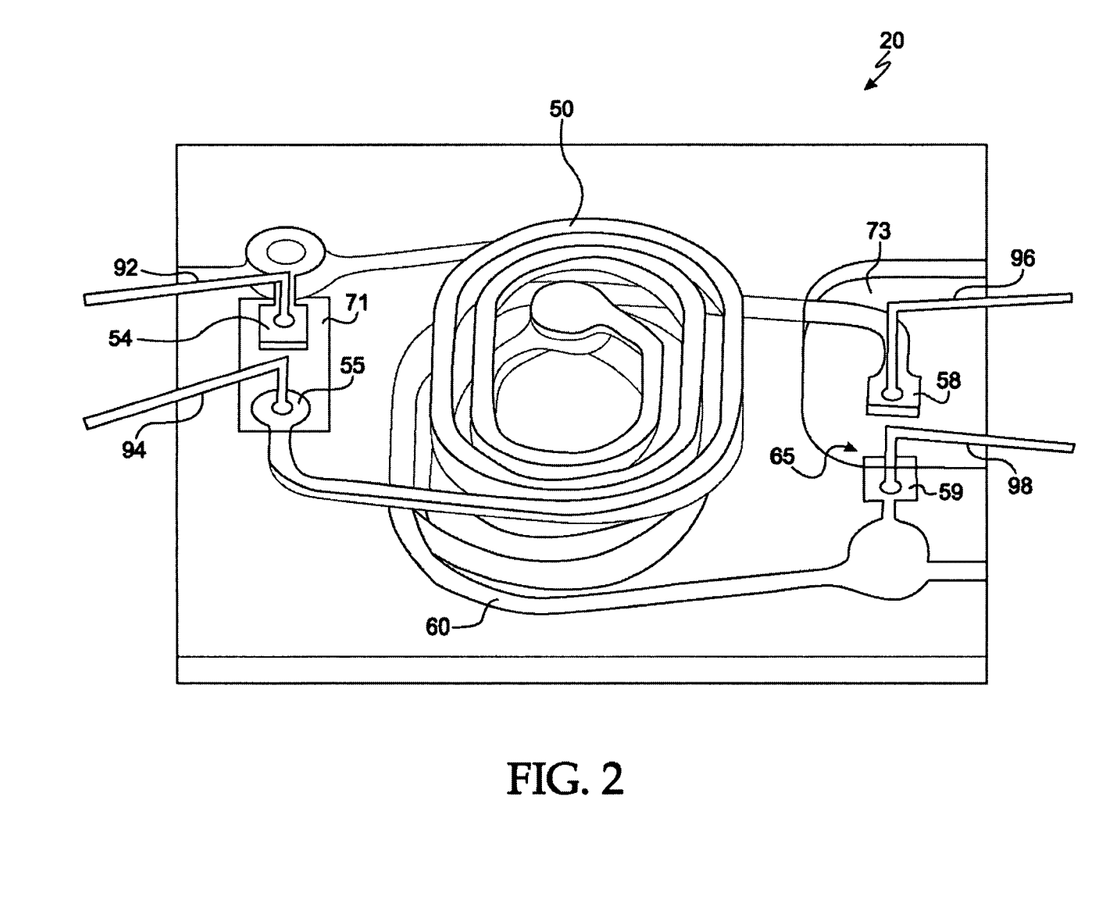
FIG. 2 shows a top perspective view of the coil transducer of FIG. 1.

Referring now to FIGS. 1 and 2, there are shown side cross-sectional and top perspective views of coil transducer 20 according to one embodiment. According to the particular application at hand, coil transducer 20 may be configured to operate as a data transfer device or a power transfer device. As illustrated, coil transducer 20 comprises a generally planar electrically insulating and dielectric barrier core structure 39 having opposing upper surface 21 and lower surface 23, and comprising central core layer 30, which forms a dielectric barrier between first coil 50 and second coil 60. As further shown in FIG. 1, in one embodiment core structure 39 further comprises upper core layer 31 disposed above central core layer 30, and lower core layer 33 disposed below central core layer 30. Upper solid layer 42 is in turn located above core structure 39, while lower solid layer 44 is located below core structure 39. Cover layers 46 and 48 are preferably disposed above upper solid layer 42 and coil 50 and below lower solid layer 44 and coil 60, respectively.

Any one or more of layers 30, 31, 33, 42, 44, 46, and 48 may comprise one or more of an adhesive, polyimide, polyimide resin; "sticky" polyimide or "sticky" KAPTON™ (e.g., adhesive-coated polyimide films or adhesive-coated KAPTON™, respectively, which are polyimide-containing materials comprising adhesives), polyimide film, acrylic, epoxy, an epoxy modifier, an epoxy resin, a polymer, a plastic, a flex circuit material, fiberglass, glass, ceramic, a polymer, an organic material, FR4 and other printed circuit board materials, PTFE and glass, PTFE and ceramic, glass and ceramic, thermoset plastic, DuPont™ KAPTON™, DUPONT™ PYRALUX AB™ laminate, and a ROGERS™ material (e.g., PTFE—or polytetrafluoroethylene—and glass, PTFE and ceramic, PTFE, glass and ceramic, or thermoset plastic). The particular choice of the materials from which such layers are formed will, in general, depend on cost, the degree or amount of electrical isolation or voltage breakdown protection that is desired, the particular application at hand, and other factors or considerations. For example, glass and ceramic substrates are well suited for applications involving high voltages; to reduce manufacturing and processing costs, flex circuit substrates may be employed. When adhesives are employed, polyimide-based adhesives are preferred owing to their low dielectric loss characteristics.

Note that dielectric barrier and electrically insulating core structure 39, as well as other layers contained in coil transducer 20, may be configured to impart structural rigidity and mechanical strength to coil transducer 20. In preferred embodiments, dielectric barrier and electrically insulating core structure 39 has a thickness between upper and lower surfaces thereof ranging between about 1 mil and about 10 mils, between about 1 mil and about 8 mils, or between about 2 mils and about 5 mils. A preferred thickness for core structure 39 ranges between about 2 mils and about 5 mils (after the lamination process described below has been completed).

Layer 30 is a central core layer having opposing upper and lower surfaces 32 and 34, has no vias disposed therethrough, and preferably comprises a polyimide-containing material such as DuPont™ KAPTON™ polyimide that is in a substantially solid state before the various individual components of coil transducer 20 are assembled together and formed (more about which is said below). A preferred material for forming central core layer 30 is KAPTON™ polyimide, and a preferred thickness 37 for central core layer 30 ranges between about 1 mil and about 2 mils, although other ranges of thickness may also be suitable, such as between about 0.5 mil and about 8 mils, or any other suitable range of thicknesses. Note further that central core layer 30 itself may comprise a plurality of stacked layers comprising, for example, one or more layers of adhesive.

In one embodiment, central core layer 30 is formed of an appropriate electrically insulating, non-metallic, non-semiconductor, low dielectric loss material having a dielectric loss tangent at room temperature that is less than about 0.05, less than about 0.01, less than about 0.001 or less than about 0.0001. Even though the material employed to form central core layer 30 is a non-semiconductor material, we define dielectric loss tangent values associated therewith herein to permit comparison of the novel substrate material of the invention to known semiconductor materials.

Further information regarding dielectric loss tangents and the intrinsic and extrinsic losses associated therewith is set forth in "Loss Characteristics of Silicon Substrate with Different Resistivities" to Yang et al., pp. 1773-76, vol. 48, No. 9, Sep. 2006, Microwave and Optical Technology Letters. Yang et al. discuss theoretically and experimentally dividing dielectric losses into an intrinsic loss tangent of silicon and an extrinsic loss associated with substrate leakage losses, and demonstrate that as doping levels in silicon increase, extrinsic losses also increase.

Upper solid layer 42 and lower solid layer 44 are also preferably formed of a polyimide-containing material such as KAPTON™ that is in a substantially solid state before the various individual components of coil transducer 20 are assembled together and formed.

In a preferred method of making coil transducer 20, upper solid layer 42 has metal layers 41 and 43 patterned on the top and bottom surfaces thereof to form first coil 50 in conjunction with blind vias 51 and 52 formed therethrough, which provide electrical connections between layers metal 41 and 43. (Vias 51 and 52 are blind vias because they do not penetrate central core layer 30.) Likewise, lower solid layer 44 has metal layers 45 and 47 lithographically patterned on the top and bottom surfaces thereof to form second coil 60 in conjunction with vias 53 and 54 formed therethrough to provide electrical connections between metal layers 45 and 47. (Vias 53 and 54 are also blind vias because they do not penetrate central core layer 30.) Metal layers 41, 43, 45 and 47 may be formed of gold, nickel, silver, copper, tungsten, tin, aluminum, and other suitable metals, or metal alloys or combinations thereof.

Note that coils 50 and 60 may assume any of a number of different structural configurations and nevertheless fall within the scope of the invention. For example, coils 50 and 60 may assume the circular or oval spirally-wound shapes shown in FIGS. 2 and 4, or may assume myriad other shapes such as rectangularly, squarely, triangularly, pentagonally, hexagonally, heptagonally or octagonally-wound shapes arranged in a horizontal plane, conductors arranged to interleave with one another within a horizontal plane, one or more serpentine conductors arranged in a horizontal plane, and so on. Any suitable structural configuration of coils 50 and 60 is permitted so long as the magnetic fields projected by one coil may be received and sufficiently well detected by the other opposing coil.

Next, upper core layer 31, which preferably comprises a polyimide-containing material comprising an adhesive, is disposed between central core layer 30 and upper solid layer 42, and lower core layer 33, which also preferably comprises a polyimide-containing material comprising an adhesive, is disposed between central core layer 30 and lower solid layer 44. Upper and lower core layers 31 and 33 are most preferably formed of a suitable material such as "sticky" KAPTON™ that is formulated to polymerize and cross-link at predetermined temperatures and/or pressures. Other materials may also be used to form layers 31 and 33, such as materials containing flexible acrylic adhesives and/or blends of polyimide resins and epoxy modifiers. "Sticky" KAPTON™ is formulated to be somewhat malleable and deformable at room temperature. Thus, upper core layer 31 is preferably configured and formulated to flow and deform around the various portions of metal layer 43 and first coil 50 when a vacuum, heat and/or pressure are applied thereto. Similarly, lower core layer 33 is preferably configured and formulated to flow and deform around the various portions of metal layer 45 and second coil 60 when a vacuum, heat and/or pressure are applied thereto during the lamination process (described in further detail below). Preferred thicknesses for upper and lower core layers 31 and 33, prior to the lamination process, range between about 1 mil and about 5 mils. A most preferred thickness for upper core layer 31 or lower core layer 33 is about 1.4 mils prior to the lamination process described below.

Upper and lower cover layers 46 and 48 are next disposed above upper solid layer 42 and below lower solid layer 44. According to one embodiment, cover layers 46 and 48 may be formed of "sticky" KAPTON™ that is formulated to polymerize and cross-link at predetermined temperatures and/or pressures, although the specific formulations and thicknesses of cover layers 46 and 48 may differ from those of adhesive layers 31 and 33, and may also differ with respect to one another. Other materials and processes may also be used to form upper and lower cover layers 46 and 48, such as materials containing flexible acrylic adhesives, blends of polyimide resins and epoxy modifiers, electrically insulating spin-coated liquids, or other suitable electrically insulating materials initially applied in liquid form.

For example, and according to some embodiments, prior to application over first and second coils 50 and 60, cover layers 46 and 48 may be coated on a sheet of polyimide film or on a protective release sheet. Cover layers 46 and 48 are peeled off their respective sheets and laid down over metal layer 41 and metal layer 47. Similar to upper and lower core layers 31 and 33, cover layers 46 and 48 are preferably configured and formulated to flow and deform around the various portions of metal layers 41 and 47 of first and second coils 50 and 60, respectively, when a vacuum, heat and/or pressure are applied thereto during the lamination process.

Preferred thicknesses for cover layers 46 and 48, prior to the lamination process, range between about 1 mil and about 10 mils. In a preferred embodiment, and as shown in FIG. 1, bottom cover layer 48 is thicker than upper cover layer 46 so as to provide additional electrical insulation and shielding between second coil 60 and any electrically conductive lead frames or other electrically conductive components that may be disposed therebeneath. For example, cover layer 48 may have thickness exceeding about 1 mil after the lamination process has been completed, while cover layer 46 may have a thickness less than about 1 mil, also after the lamination process has been completed.

As shown in FIG. 2, cut-outs or holes 71 and 73 are preferably formed in cover layer 46 at locations corresponding to contacts 54, 55, 58 and 59 so that wirebonds 92, 94, 96 and 98 may be attached thereto. In addition, the material denoted by numeral 65 in FIG. 1 is preferably removed to provide wirebond access to contacts 58 and 59 by way of recess 65 shown in FIG. 2. The preferred flowable, malleable and deformational properties of upper and lower core layers 31 and 33, and of cover layers 46 and 48, have been found to be especially important if a coil transducer 20 having no, few or very small air pockets or bubbles disposed within such layers is to be provided after the lamination process has been completed. It has been discovered that air pockets and bubbles remaining in layers 31, 33, 46 and 48 after the lamination process has been completed can result in substantial degradation of the performance of coil transducer 20 by resulting, for example, in arcing or high voltage breakdown. Thus, bubbles or air pockets in layers 31, 33, 46 and 48 should be minimized or eliminated. Note that once the lamination process has been completed, each of the layers in coil transducer 20 possesses varying degrees of rigidity, although coil transducer 20 may retain or exhibit some degree of flexibility or bendability, as is typical of some flex-type devices.

Note further that each of layers 30, 31 and 33 comprises an electrically insulating, non-metallic, non-semiconductor, low-dielectric-loss material such as the KAPTON™ and/or sticky KAPTON™ materials described above, or any other suitable material capable of providing such properties. Note still further that it has been discovered that the dielectric properties of coil transducer 20 are improved by providing multiple layers of dielectric barrier and electrically insulating material, prior to the lamination process, to form dielectric barrier and electrically insulating core structure 39. Interestingly and unexpectedly, the high-voltage hold-off performance of coil transducer 20 has been discovered to increase through the use of such multiple layers in core structure 39. It has also been discovered that upper and lower core layers 31 and 33 contribute materially to such improved high-voltage hold-off performance.

Continuing to refer to FIGS. 1 and 2, it will be noted that core layer 30 has no vias disposed therethrough or therein and that first and second coils 50 and 60 are spatially arranged and configured respecting one another such that at least one of power and data signals may be transmitted by first coil 50 to second coil 60 across core layer 30. The lack of vias in core layer 30 improves the high voltage hold-off or breakdown characteristics of coil transducer 20 by eliminating potential arcing or shorting pathways across central core layer 30 between first coil 50 and second coil 60.

In a preferred embodiment, core layer 30 has sufficient thickness between the upper and lower surfaces thereof, and electrical insulation characteristics appropriate, to withstand the relatively high breakdown voltages for which coil transducer 20 is designed. It has been discovered that coil transducer 20, and the individual layers of core structure 39, can be configured to exhibit a breakdown voltage between first coil 50 and second coil 60 that exceeds about 2,000 volts RMS when applied over a time period of about one minute, exceeds about 2,000 volts RMS when applied over a time period of about six minutes, or exceeds about 2,000 volts RMS when applied over a time period of 24 hours. Alternatively, coil transducer 20, and the individual layers of structure 39, can be configured to exhibit a breakdown voltage between first coil 50 and second coil 60 that exceeds about 5,000 volts RMS when applied over a time period of about one minute, exceeds about 5,000 volts RMS when applied over a time period of about six minutes, or exceeds about 5,000 volts RMS when applied over a time period of 24 hours.

Ramp-to-destruction testing of prototypes of overmolded coil transducer packages manufactured in accordance with the teachings disclosed herein, where ramping occurs at a rate of about 1 kV per minute, has shown that a central core layer 30 two mils thick and formed of solid KAPTON that is sandwiched between 1.4 mil thick upper and lower core layers formed of sticky KAPTON can withstand hold-off voltages up to about 10 kV or 11 kV. Ramp-to-destruction testing of prototypes of overmolded coil transducer packages manufactured in accordance with the teachings disclosed herein, where ramping also occurs at a rate of about 1 kV per minute, has shown that a central core layer 30 one mil thick and formed of solid KAPTON that is sandwiched between 1.4 mil thick upper and lower core layers formed of sticky KAPTON can withstand hold-off voltages up to about 8 kV.

FIG. 1 shows busbars 72 and 74, which in the embodiment shown form extensions attached to or forming portions of first coil 50 and second metallized layer 43, and second coil 60 and fourth metallized layer 47. Busbars 72 and 74 are employed during an electroplating process to provide electrical connection to adjoining like devices in an electroplating bath. In some embodiments, first and second coils 50 and 60 are initially formed of copper, and then electroplated with nickel and then gold. To avoid obscuring the invention, details concerning electroplating processes are not discussed herein, and in any event such processes are well known to those skilled in the art. As illustrated in FIG. 1, busbars 72 and 74 extend to opposing faces 15 and 17 of coil transducer 20. Such a busbar configuration solves a major problem that can arise when busbars extend to the same face of a coil transducer. During the manufacturing process, hundreds or thousands of coil transducers 20 may be arranged in a single unitary panel, and must be separated by sawing cuts between the individual transducers. During the sawing process, metal shavings and particles taken from the busbars extending to the face being cut by the saw blade can be transported by the saw blade and deposited on or lodged in other portions of the same face. It has been discovered that arcing or shorting between busbars extending to the same face can occur as a result of such shavings and particles being disposed between such busbars extending to the same face.

The busbar configuration shown in FIG. 1 overcomes these problems since busbars connected to different coils and extend to different faces which are widely separated. Thus, there is little to no chance of metal particles or shavings deposited by a saw blade on one face having the opportunity to be an agent that facilitates arcing or shorting between or to another face. Note that busbars corresponding to first coil 50 and second coil 60 need not extend to opposing faces, but only need extend to different faces. Thus, one busbar may extend to a vertically-oriented face such as face 15, while another busbar may extend to a horizontally-oriented face such as face 19. Many other combinations of opposing or adjoining faces are also possible.

Figure 3:
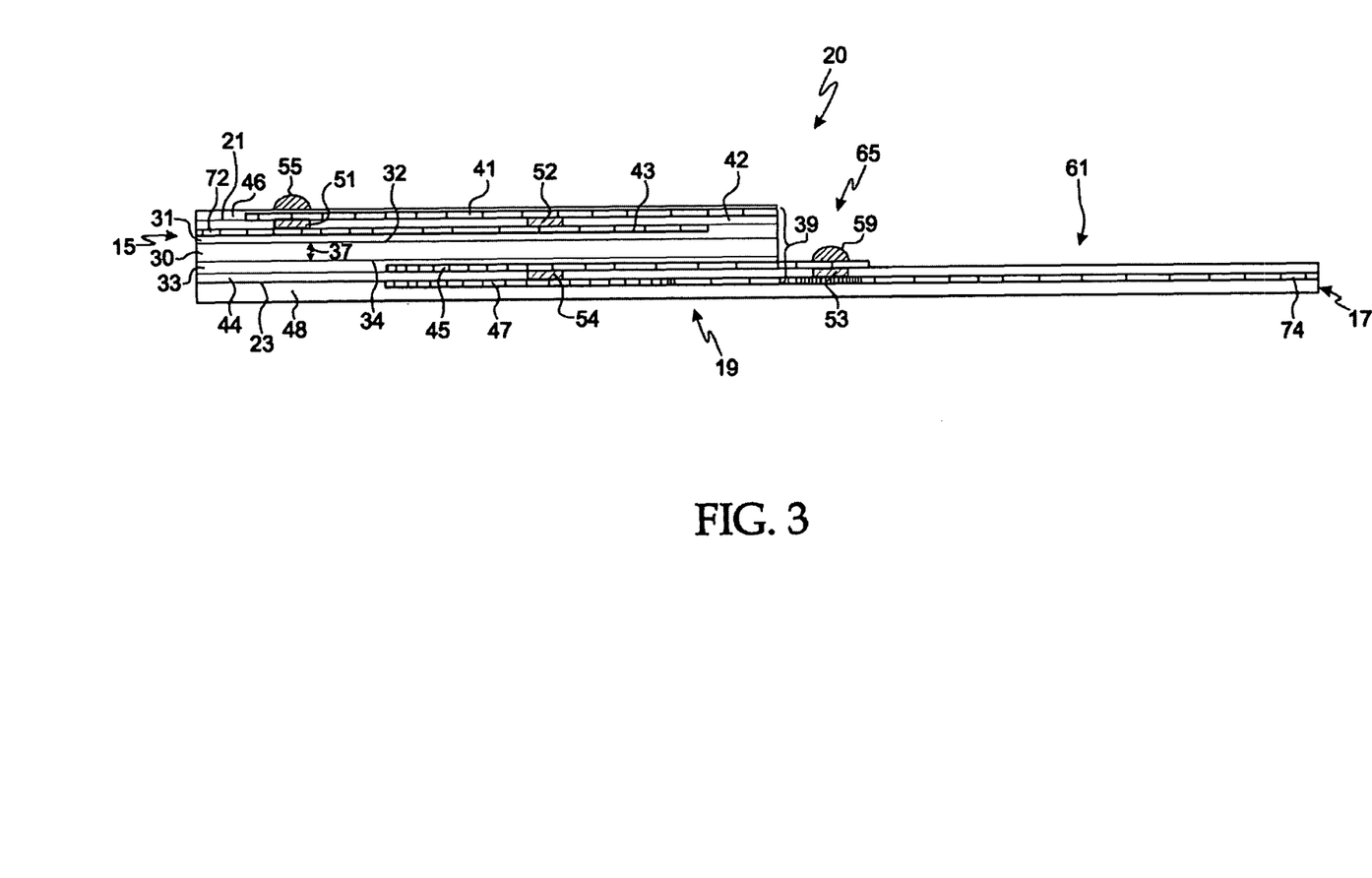
FIG. 3 shows a side cross-sectional view of a coil transducer according to another embodiment.
Figure 4:
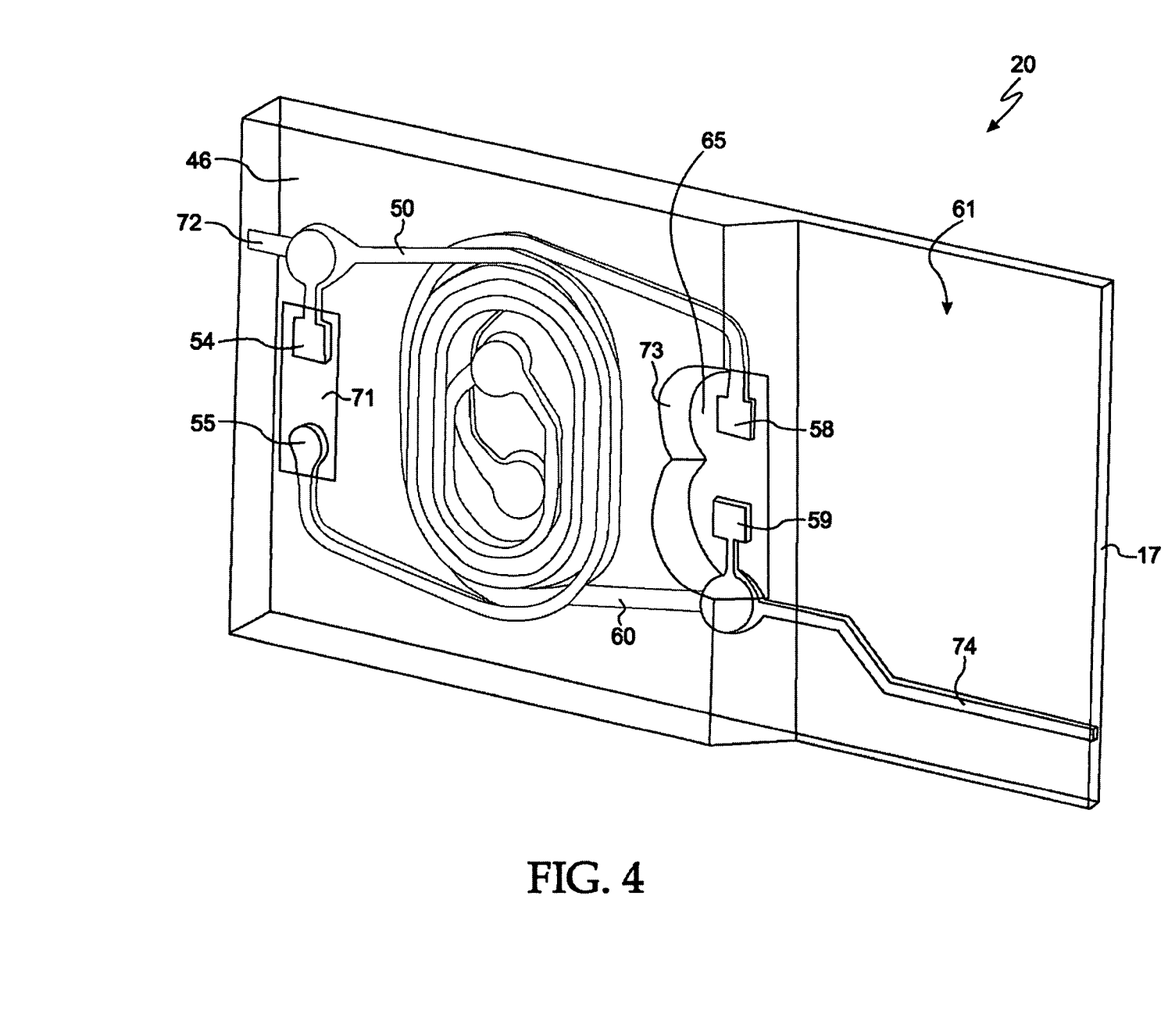
FIG. 4 shows a top perspective view of the coil transducer of FIG. 3.
Figure 5:
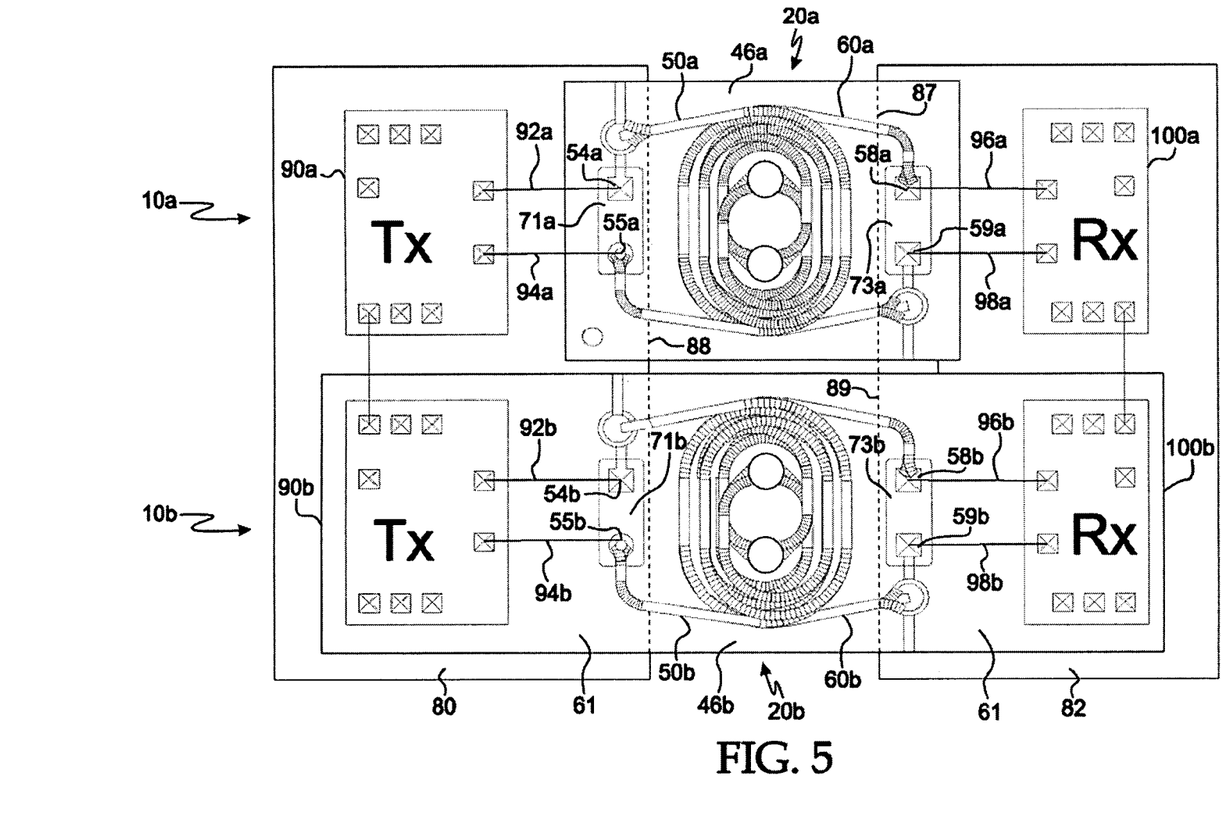
FIG. 5 shows a top perspective view of two coil transducers according to other embodiments.

Referring now to FIGS. 3 and 4, there are shown side cross-sectional and top perspective views of coil transducer 20 according to another embodiment which further comprises extension 61, which in one embodiment may be configured to permit the placement of a transmitter and/or receiver integrated circuit ("IC") thereatop or thereon for operable connection to first and/or second coils 50 and 60 of coil transducer 20. Recess 65 provides wirebond access between contacts 58 and 59 and a receiver or transmitter circuit or integrated circuit disposed atop extension 61. A second extension may also be formed or provided to the left of coil transducer 20 shown in FIG. 3 to provide a structure atop which one of a receiver and transmitter circuit or integrated circuit may be mounted (see, for example, FIG. 5). Extension 61 permits receiver and/or transmitter circuits to be disposed in relatively close proximity to the contacts to which wirebonds are to be connected while avoiding placing such receiver and/or transmitter circuits directly above any portion of coils 50 or 60, which may cause loss of functionality of coil transducer 20. Note that in preferred embodiments extension 61 further comprises at least one metallized ground pad disposed thereon and operably connected to an external ground. Such ground pads may be employed to provide ground connections for ICs 90 and 100, and also may be configured to act as thermal sinks to draw heat away from coil transducer system 10. FIG. 5 shows another embodiment of coil transducer 20b where extensions 61 are provided.

Note that the descriptions and details set forth above regarding FIGS. 1 and 2 may be applied to the structures and various components shown in FIGS. 3 and 4. For example, the compositions and configurations of layers 30, 31, 33, 42, 44, 46 and 48, coils 50 and 60, and busbars 72 and 74, as they are described above in connection with FIGS. 1 and 2, may be applied to coil transducer 20 shown in FIGS. 3 and 4.

Referring now to FIG. 5, in preferred embodiments edges 88 and 89 of lead frames 80 and 82, respectively, should not extend beneath the outer edges of the coil turns of coils 50 and 60 to prevent performance degradation or loss of functionality, but should extend beneath wirebond pads 54a/55a, 54b/55b, 58a/59a and 58b/59b so as to provide structural support during the wirebonding process. In addition, gluing receiver or transmitter ICs atop structure 61 results in a single squish-out zone of adhesive, which halves the number of squish-out zones that would otherwise occur on a lead frame if the receiver and/or transmitter ICs were glued to a lead frame along with coil transducer 20. By attaching receiver and/or transmitter ICs to one or more extensions 61 of coil transducer 20, valuable space is conserved, and coil transducer system 10 may be made smaller. Note that extension 61 may be formed of the same or some of the layers shown in FIG. 1, or alternatively may be made of different suitable electrically insulating materials.

Continuing to refer to FIG. 5, there are shown two different embodiments of a coil transducer system, system 10a and system 10b. Both systems comprise coil transducers (20a and 20b), transmitter ICs (90a and 90b), and receiver ICs (100a and 100b). Transmitter ICs 90a and 90b are operably connected to first coils 50a and 50b via wirebonds 92a-94a and 92b-94b and contacts 54a-55a and 54b-55b. Receiver ICs 100a and 100b are operably connected to second coils 60a and 60b via wirebonds 96a-98a and 96b-98b and contacts 58a-59a and 58b-59b.

As shown in FIG. 5, in system 10a coil transducer 20a is mounted on lead frames 80 and 82 such that coils 50a and 60a thereof do not extend vertically over electrically conductive portions of lead frames 80 and 82, which are denoted by edges 88 and 89, since in the embodiment illustrated in FIG. 5 lead frames 80 and 82 are formed of metal. Such a configuration prevents the performance of coil transducer 20a from being degraded or compromised by the presence of a conductor disposed within the magnetic field generated by coil transducer 20a itself. Note that coil transducer 20a has no extensions 61 forming a portion thereof, and that adhesive squish-out zones emanating from beneath transmitter 90a and receiver 100a may coalesce or interfere with adhesive squish-out zones emanating from beneath the edges of coil transducer 20a that are disposed over lead frames 80 and 82.

Contrariwise, in system 10b of FIG. 5, coil transducer 20b has wings or extensions 61 upon which are mounted transmitter 90b and receiver 100b. The adhesive squish-out zones associated with attaching transmitter 90b and receiver 100b to coil transducer 20b are spatially separated vertically from the adhesive squish-out zones associated with attaching coil transducer 20b to lead frames 80 and 82, and therefore cannot coalesce or interfere with such squish-out zones. As with coil transducer 20a, coil transducer 20b is mounted on lead frames 80 and 82 such that coils 50b and 60b thereof do not extend vertically over edges 88 and 89 of lead frames 80 and 82 to prevent degrading the performance of coil transducer 20b. If a metal layer is placed too close to the respective horizontal planes of coils 50 and 60, the magnetic field lines transmitted or sensed thereby will be disturbed and the efficiency (throughput $S_{21}$) will be decreased. Furthermore, lead frames 80 and 82 should be adequately separated to prevent arcing from inadvertently electrically connecting input circuitry to output circuitry. Consequently, it is desirable to design lead frames 80 and 82 so that the lead frames extend just far enough beneath coil transducers 20a and 20b that the bond-pads lie above the lead frames to facilitate wirebonding, but not so far beneath coil transducers 20a and 20b as to extend directly beneath portions of coils 50a and 50b or 60a and 60b.

Continuing to refer to FIG. 5, it should be noted that the electrical potential difference between lead frames 80 and 82 and coils 50a/50b and 60a/60b may be several kV; in some embodiments lead frames 80 and 82 may be held at or near their respective electrical grounds. Mounting of integrated circuits 90a through 100b on lead frames 80 and 82 or on coil transducer 20b can be effected with epoxy. Note that either of coil transducers 20a or 20b, and lead frames 80 and 82, may be encapsulated to the extent desired with a moldable electrically insulating material in a manner well known in the art.

Note that transmitter ICs 90a and 90b are preferably configured to change incoming signal waveforms into signal having waveforms suitable for driving primary transmitting or first coils 50a and 50b. Receiver ICs 100a and 100b are preferably configured to change the signals exiting secondary receiver or second coils 60a and 60b back into waveforms that look like the incoming signal. Transmitter ICs 90a and 90b, receiver ICs 100a and 100b, and coil transducers 20a and 20b are preferably packaged in a format compatible with standard electronics assembly processes, such as lead frame or printed circuit board assembly techniques. In some embodiments, packaging comprises mounting the various components of transducers 20a and 20b on lead frames 80 and 82, wirebonding the components together, and surrounding them with a molding material to hold everything together after sacrificial metal leads have been separated from the lead frames and formed into standard integrated circuit leads.

Figure 6:
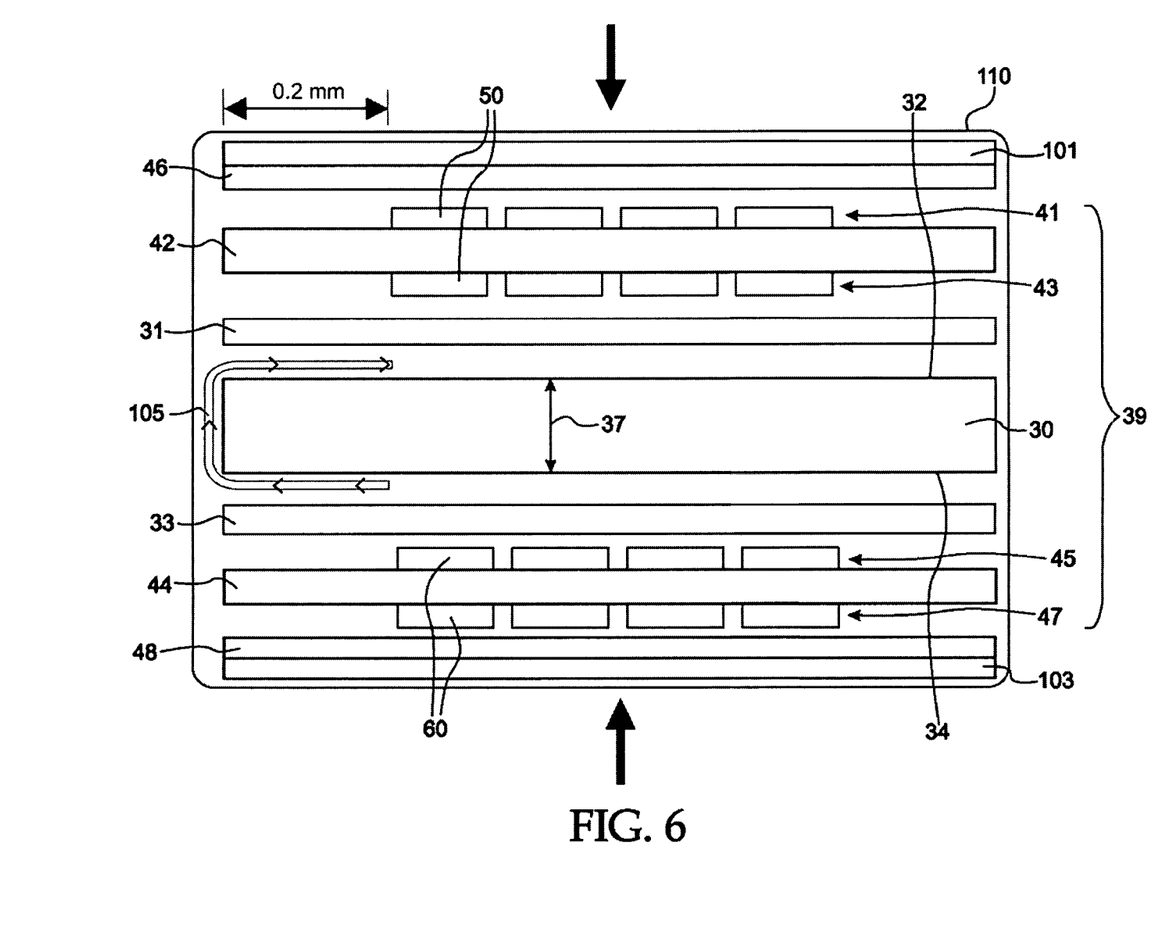
FIG. 6 shows a side cross-sectional view of one embodiment of a stacked transducer assembly during a lamination process.

Referring now to FIG. 6, there is shown a cross-sectional view of a stacked transducer assembly having pressure applied thereto during one embodiment of a lamination process. In the illustrated method, the various layers which form coil transducer 20 (i.e., layers 46, 42, 31, 30, 33, 44 and 48) are vertically stacked and arranged respecting one another. (For the sake of simplicity, vias 51, 52, 53 and 54 are not shown in FIG. 6.) The resulting stacked transducer assembly is next placed in vacuum container 110 and a full vacuum, or a vacuum of at least 27 inches, is drawn on container 110 and the stacked transducer assembly disposed therein. Next, platens 101 and 103 are provided above and below the stacked transducer assembly and vacuum container 110. A pressure between about 300 psi and about 400 psi is applied to the stacked transducer assembly while the vacuum is still being drawn; a pressure of about 350 psi is preferred. In addition, in a preferred embodiment of a method of making or laminating coil transducer 20, the stacked transducer assembly is heated to a temperature ranging between about 330 degrees F. and about 390 degrees F. while a vacuum is being drawn thereon, and while pressure is being applied thereto. Most preferably, the stacked transducer assembly is heated for a period of time sufficient to melt or crosslink any polymeric or epoxy adhesive that may be included in the assembly.

In a preferred embodiment of a method of laminating coil transducer 20, lamination (i.e., stacking layers to form the stacked transducer assembly, placing the stacked transducer assembly in a vacuum container, drawing a vacuum on the container, and applying pressure through container 110 to the stacked transducer assembly) is carried out in two separate steps. In a first step, layers 30, 31, 33, 42 and 44 are laminated together by vertically stacking such layers, placing such layers in vacuum container 110, drawing a vacuum on container 110, applying pressure with platens 101 and 103, and applying heat as described above. In a second step, cover layers 46 and 48 are disposed over the laminated stacked transducer assembly resulting from the first step, and the entire assembly is laminated together by placing the stacked transducer assembly with cover layers 46 and 48 disposed thereon and therebeneath into vacuum container 110, drawing a vacuum on container 110, applying pressure to the stacked transducer assembly with platens 101 and 102, and applying heat as described above.

As described above, the flowable, malleable and deformational properties of adhesive layers 31 and 33, and cover layers 46 and 48, are important in preventing coil transducer 20 from having no, few or very small air pockets, voids or bubbles disposed within such layers after the lamination process has been completed. To that end, it has been discovered that the vacuums and pressures disclosed above be employed in the lamination process, as they are generally of sufficient magnitude to prevent the formation of such bubbles or voids.

FIG. 6 further shows potential electrical shorting or arcing travel path 105 disposed along portions of the bottom, side and top surfaces of central core layer 30. As illustrated, potential arcing or shorting travel path 105 comprises upper and lower horizontal legs disposed along horizontal interfaces located between adjoining layers, where the two such horizontal legs have a total distance of about 0.4 mm. In the various embodiments of coil transducer 20, it has been discovered that so long as the total horizontal distance along potential arcing or shorting travel path 105 is 0.4 mm or longer, the possibility of electrical shorting or arcing occurring along path 105 is minimized, even though central layer 30 may be as thin as one mil, or in some embodiments, even thinner. Thus, according to one embodiment, all first portions of coil transducer 20 that are electrically connected to first coil 50 are located a minimum of at least 0.4 mm away, in any horizontal direction along horizontal interfaces located between adjoining layers, from all second portions of coil transducer 20 that are electrically connected to second coil 60.

Note that included within the scope of the present invention are methods of making and having made the various components, devices and systems described herein.

The above-described embodiments should be considered as examples of the present invention, rather than as limiting the scope of the invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

We claim:

1. A coil transducer, comprising:
   a generally planar dielectric barrier and electrically insulating core structure having upper and lower surfaces and comprising a central core layer, an upper core layer disposed above the central core layer and a lower core layer disposed below the central core layer, each of the central, upper and lower core layers comprising an electrically insulating, non-metallic, non-semiconductor, low-dielectric-loss material;
   a first electrically conductive coil disposed within, upon or near the upper surface of the core structure;
   a second electrically conductive coil disposed within, upon or near the lower surface of the core structure;
   an input lead frame;
   an output lead frame;
   wherein the central core layer has no vias disposed therethrough or therein in a region of the central core layer disposed directly between the first coil and the second coil, the first and second coils are spatially arranged and configured respecting one another such that at least one of power and data signals may be transmitted by the first coil to the second coil across the portion of the central core layer containing no vias, the central core layer has a thickness ranging between about 0.5 mils and about 8 mils, electrical connections to both of the first and second coils are established through one only of the upper surface and the lower surface, and the input and output lead frames are operably connected to the coil transducer.

2. The coil transducer of claim 1, wherein the central core layer is solid and comprises polyimide.

3. The coil transducer of claim 1, wherein the upper and lower core layers comprise an adhesive.

4. The coil transducer of claim 3, further comprising an upper solid layer having first and second metallized layers disposed on or in upper and lower surfaces thereof to form at least portions of the first coil, the upper solid layer being disposed above the upper core layer, and a lower solid layer having third and fourth metallized layers disposed on or in upper and lower surfaces thereof to form at least portions of the second coil, the lower solid layer being disposed below the lower core layer.

5. The coil transducer of claim 4, wherein the upper core layer is in contact with at least portions of the second metallized layer and the lower core layer is in contact with at least portions of the third metallized layer.

6. The coil transducer of either of claim 5, further comprising an upper cover layer located above the upper solid layer and at least portions of the first metallized layer, the upper cover layer comprising an electrically insulating, non-metallic, non-semiconductor, low-dielectric-loss material, and a lower cover layer located below the lower solid layer and at least portions of the third metallized layer, the lower cover layer comprising an electrically insulating, non-metallic, non-semiconductor, low-dielectric-loss material.

7. The coil transducer of claim 6, wherein the lower cover layer is thicker than the upper cover layer, and the thickness of the lower cover layer is greater than or equal to about 1 mil.

8. The coil transducer of claim 6, wherein at least one of the upper cover layer and the lower cover layer comprises polyimide.

9. The coil transducer of claim 1, further comprising an extension configured to have disposed thereon or therein at least one of a receiver circuit and a transmitter circuit.

10. The coil transducer of claim 9, wherein the extension further comprises at least one metallized ground pad disposed thereon and operably connected to an external ground.

11. The coil transducer of claim 1, wherein a portion of the core structure has been removed to permit an electrical connection to be established through the structure to the second coil.

12. The coil transducer of claim 1, further comprising at least first and second busbars electrically connected to the first and second coils, respectively.

13. The coil transducer of claim 12, wherein the first busbar is configured to extend from the first coil to a first face of the coil transducer, and the second busbar is configured to extend from the second coil to a second face of the coil transducer.

14. The coil transducer of claim 1, wherein the core structure is configured to impart structural rigidity and mechanical strength to the coil transducer.

15. The coil transducer of claim 1, wherein at least one of the layers in the core structure further comprises one or more of an adhesive, polyimide, polyimide resin, sticky polyimide, polyimide film, a polymer, acrylic, epoxy, an epoxy modifier, an epoxy resin, a polymer, a plastic, a thermoset plastic, a flex circuit material, fiberglass, glass, ceramic, an organic material, a printed circuit board material, PTFE and glass, PTFE and ceramic, glass and ceramic, an organic material, and a combination of an organic filler and an inorganic solid.

16. The coil transducer of claim 1, wherein a breakdown voltage between the first coil and the second coil exceeds about 2,000 volts RMS when applied over a time period of about one minute, exceeds about 2,000 volts RMS when applied over a time period of about six minutes, or exceeds about 2,000 volts RMS when applied over a time period of 24 hours.

17. The coil transducer of claim 1, wherein a breakdown voltage between the first coil and the second coil exceeds about 5,000 volts RMS when applied over a time period of about one minute, exceeds about 5,000 volts RMS when applied over a time period of about six minutes, or exceeds about 5,000 volts RMS when applied over a time period of 24 hours.

18. The coil transducer of claim 1, wherein the core structure has a thickness between upper and lower surfaces thereof ranging between about 1 mil and about 10 mils, between about 1 mil and about 8 mils, or between about 1 mil and about 5 mils.

19. The coil transducer of claim 1, wherein the central core layer has a thickness ranging between about 1 mil and about 7 mils.

20. The coil transducer of claim 1, wherein electrically conductive portions of the lead frames are configured not to extend beneath the dielectric barrier and electrically insulating structure to locations directly beneath the first or second coils.

21. The coil transducer of claim 1, further comprising a moldable electrically insulating material encapsulating at least portions of the coil transducer and the input and output lead frames.

22. The coil transducer of claim 1, wherein the coil transducer is configured to operate as one of a data transfer device and a power transfer device.

23. The coil transducer of claim 1, wherein the first coil is operably connected to a transmitter circuit and the second coil is operably connected to a receiver circuit.

24. The coil transducer of claim 1, wherein at least one of the first coil and the second coil comprises at least one of gold, nickel, silver, copper, tungsten, tin, and aluminum, or alloys or combinations of any of the foregoing metals.

25. The coil transducer of claim 1, wherein first portions thereof electrically connected to the first coil are, in any horizontal direction along one or more interfaces disposed between adjoining layers, a minimum of at least 0.4 mm away from second portions thereof electrically connected to the second coil.

26. The coil transducer of claim 1, wherein the central core layer has a dielectric loss tangent at room temperature that is less than or equal to 0.05.

* * * * *